US011770917B2

(12) United States Patent
Boisnier et al.

(10) Patent No.: US 11,770,917 B2
(45) Date of Patent: Sep. 26, 2023

(54) ELECTRIC DISTRIBUTION MODULE SPLIT INTO COMPARTMENTS BY PARTITIONS HAVING CHANNELS FOR VENTILATION AND/OR THE PASSAGE OF CONTROL CABLES

(71) Applicant: SAFRAN ELECTRICAL & POWER, Blagnac (FR)

(72) Inventors: Benjamin Boisnier, Moissy-Cramayel (FR); Loïc Lemasson, Moissy-Cramayel (FR); Philippe Pierre Avignon, Moissy-Cramayel (FR)

(73) Assignee: SAFRAN ELECTRICAL & POWER, Blagnac (FR)

( * ) Notice: Subject to any disclaimer, the term of this patent is extended or adjusted under 35 U.S.C. 154(b) by 194 days.

(21) Appl. No.: 17/419,484

(22) PCT Filed: Dec. 18, 2019

(86) PCT No.: PCT/FR2019/053161
§ 371 (c)(1),
(2) Date: Jun. 29, 2021

(87) PCT Pub. No.: WO2020/141270
PCT Pub. Date: Jul. 9, 2020

(65) Prior Publication Data
US 2022/0094144 A1 Mar. 24, 2022

(30) Foreign Application Priority Data

Jan. 2, 2019 (FR) ........................ 1900010

(51) Int. Cl.
*H05K 7/20* (2006.01)

(52) U.S. Cl.
CPC ..... *H05K 7/20909* (2013.01); *H05K 7/20145* (2013.01)

(58) Field of Classification Search
CPC ............ H05K 7/20145; H05K 5/0026; H05K 5/0217; H05K 5/0247; H05K 7/14; H05K 5/0213; H05K 7/1457; H02M 7/003
(Continued)

(56) References Cited

U.S. PATENT DOCUMENTS 4,816,613 A * 3/1989 Ito ......................... H05K 9/006
174/DIG. 35
6,212,087 B1 4/2001 Grant et al.
(Continued)

FOREIGN PATENT DOCUMENTS

EP 1278296 A1 1/2003

OTHER PUBLICATIONS

Search Report issued in French Patent Application No. 1900010 dated Oct. 16, 2019.
(Continued)

*Primary Examiner* — Mandeep S Buttar
(74) *Attorney, Agent, or Firm* — Pearne & Gordon LLP

(57) ABSTRACT

An electric distribution module includes a plate bearing a main partition and lateral partitions that jointly delimit a plurality of housings, wherein the main partition has at least one channel, and wherein each lateral partition comprises at least one channel that is terminated by an opening leading into a housing that this lateral partition delimits and that communicates with a channel of the main partition, so as to ensure, via these channels, independent ventilation of each housing and/or the routing and holding of control cables towards each housing.

9 Claims, 4 Drawing Sheets

(58) Field of Classification Search
USPC .......................................................... 31/624
See application file for complete search history.

(56) References Cited

U.S. PATENT DOCUMENTS

| | | | | |
|---|---|---|---|---|
| 10,123,442 | B1* | 11/2018 | Lin | H05K 7/14325 |
| 10,681,837 | B1* | 6/2020 | Davis | B64G 1/10 |
| 2009/0046430 | A1* | 2/2009 | Brewer | H05K 7/20736 |
| | | | | 361/701 |
| 2009/0090534 | A1* | 4/2009 | Regester | H04Q 1/06 |
| | | | | 174/100 |
| 2015/0216077 | A1* | 7/2015 | Tanaka | H05K 7/20145 |
| | | | | 361/689 |
| 2020/0220296 | A1* | 7/2020 | Wang | G02B 6/4277 |
| 2020/0375063 | A1* | 11/2020 | Reichenbach | H05K 7/2089 |
| 2022/0322568 | A1* | 10/2022 | Liu | H05K 7/20145 |
| 2023/0049278 | A1* | 2/2023 | Chen | H05K 5/03 |

OTHER PUBLICATIONS

International Search Report for issued in Application No. PCT/FR2019/053161 dated Apr. 23, 2020.
Written Opinion for PCT/FR2019/053161 dated Apr. 23, 2020.

* cited by examiner

ELECTRIC DISTRIBUTION MODULE SPLIT INTO COMPARTMENTS BY PARTITIONS HAVING CHANNELS FOR VENTILATION AND/OR THE PASSAGE OF CONTROL CABLES

This is the National Stage of PCT international application PCT/FR2019/053161, filed on Dec. 18, 2019 entitled "ELECTRIC DISTRIBUTION MODULE SPLIT INTO COMPARTMENTS BY PARTITIONS HAVING CHANNELS FOR VENTILATION AND/OR THE PASSAGE OF CONTROL CABLES", which claims the priority of French Patent Application No. 1900010 filed Jan. 2, 2019, both of which are incorporated herein by reference in their entirety.

TECHNICAL FIELD

The invention relates to an electric distribution module for aeronautics application bearing power components controlled by control cables, such a module being typically part of an electrical distribution furniture wherein several modules are mounted.

PRIOR ART

As diagrammatically shown in FIG. 1, an electric distribution module 1 intended for being installed in an aircraft electrical furniture includes a structure 2 that here has the shape of a tray wherein different power components 3 are installed which are typically switching elements and circuit breakers.

This structure 2 is provided with several internal partitions 4, that delimit compartments that each receive several power components 3, each component being controlled by a control cable 6 fastened by collars to the upper portions of the partitions 4 or of the lateral walls of the structure 2.

Each component 3 is moreover connected to busbars that are not visible in FIG. 1 which are added in the lower region of the structure 2 of the module, to be at a distance from the control cables 6 so as to not disturb the control signals circulating in these cables.

Such a module thus includes many fastening elements such as collars for fastening control cables, members for fastening busbars, as well as many elements for marking these electrical conductors, in such a way that the mounting and the connection of the components with their cables and their busbars in the structure is tedious, and hence expensive.

Moreover, these components 3 are ventilated by a global air flow not shown to cool them. In case of overheating of a component, this ventilation may be insufficient, the component in question can then overheat and even catch on fire, heating in turn the other components.

The purpose of the invention is to provide an arrangement of an electric distribution module that is compact and simple to equip while providing at least one segregation of the control cables and of the busbars and an effective cooling of the electric components.

DISCLOSURE OF THE INVENTION

To this effect, the object of the invention is an electric distribution module comprising a plate provided with busbars and bearing a main partition as well as lateral partitions that jointly delimit a plurality of housings each intended for receiving an electric power component, wherein the main partition includes at least one channel, and wherein each lateral partition comprises at least one channel that communicates with a channel of the main partition and that is terminated by an opening leading into a housing that this lateral partition delimits, so to as to ensure, via these channels the routing and holding of control cables towards each housing and/or independent ventilation of each housing.

Thanks to the invention, the partitions provide a segregation of the control cables and/or an optimised cooling as close as possible to each one of the electric components of the module.

The invention also relates to a module thus defined, wherein the main partition includes an air circulation channel and an electrical channel forming a duct for receiving one or more control cables, and wherein each lateral partition includes an air circulation channel and an electrical channel forming a duct for receiving control cables that communicates with a corresponding channel of the main partition.

The invention also relates to a module thus defined, wherein each lateral partition includes an opening terminating its electrical channel and forming a seat bearing a control socket connected to control cable extending in this electrical channel, and wherein this socket is oriented perpendicularly to the plate to receive a connector of an electric power component.

The invention also relates to a module thus defined, comprising a general control socket located at the end of the main partition that is connected to each control socket by control cables extending in the electric channels of the main partition and lateral partitions.

The invention also relates to a module thus defined, including busbars integrated into the thickness of the plate and which each include an end extending beyond a face of this plate to form a power terminal for an electric power component.

The invention also relates to a module thus defined, wherein each power terminal includes a tapped hole oriented perpendicularly to the plate The invention also relates to a module thus defined, wherein each partition includes at least one wall covered with a fire-resistant coating over most of its surface.

The invention also relates to a module thus defined, wherein the main partition includes two walls both covered with a fire-resistant coating over most of their respective surfaces.

The invention also relates to a module thus defined, provided with at least one power component including an extraction lever.

DETAILED DISCLOSURE OF PARTICULAR EMBODIMENTS

The idea at the basis of the invention is to provide a module of which the separation partitions comprise channels that communicate with each other to on the one hand route the control cables at a distance from the busbars, and on the other hand provide a ventilation as close as possible to each component.

Figure 1:
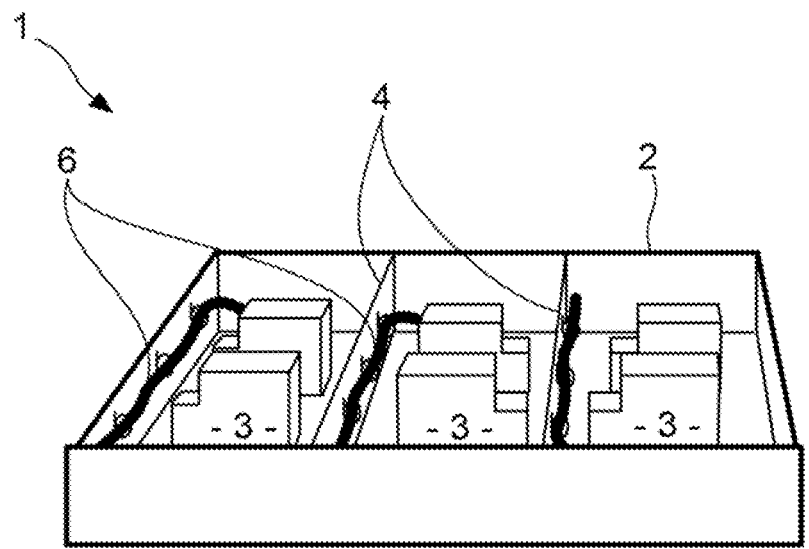
FIG. 1 already described is a general view of an electric distribution module of the prior art.
Figure 2:
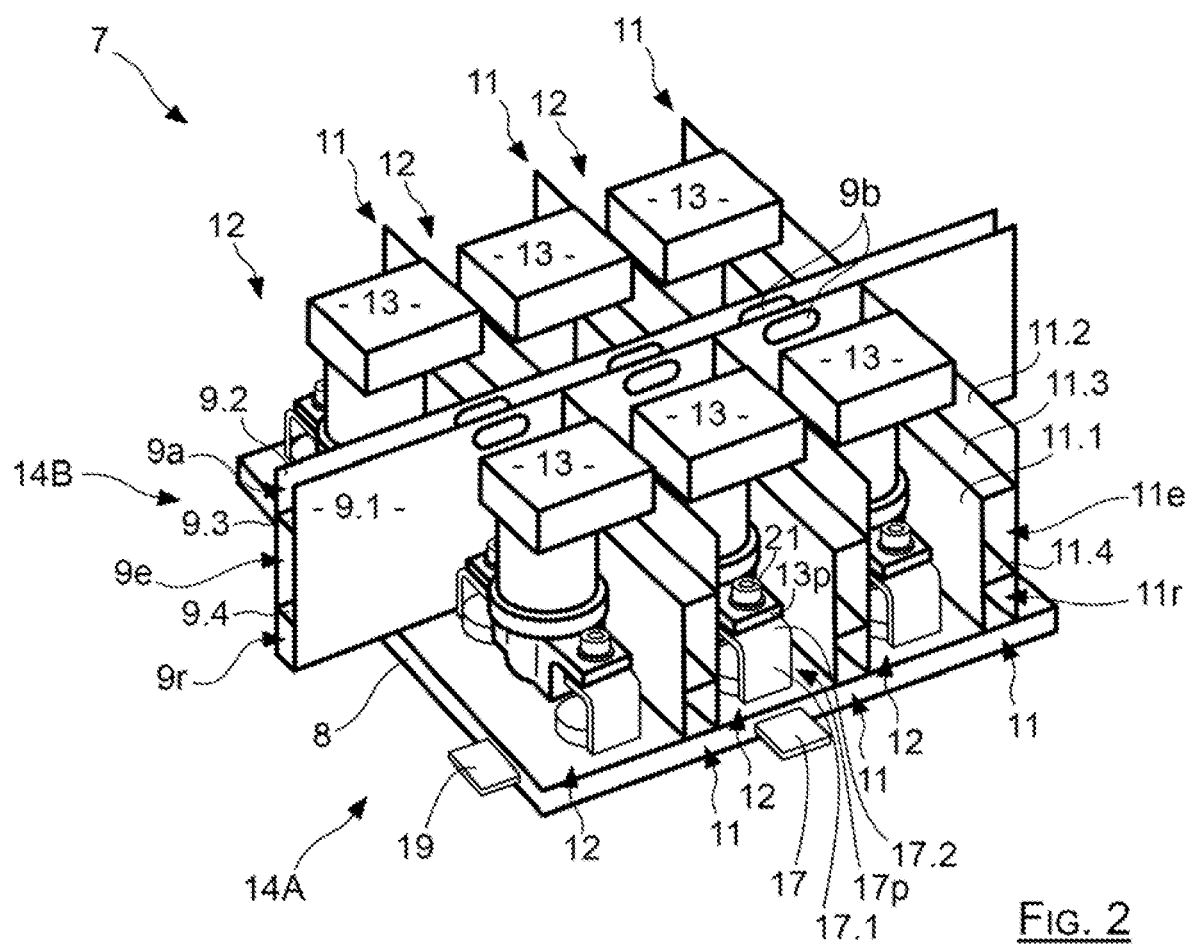
FIG. 2 is a diagrammatical view showing the general arrangement of the module as well as partitions and electric components according to the invention.

As can be seen in FIG. 2, the module according to the invention includes a generally rectangular plate 8 bearing a main partition 9 and six lateral partitions 11 to delimit six housings 12 each receiving a single electric power component 13.

Partitions

The main partition 9 has a general rectangular shape and extends perpendicularly to the plate 8 according to a so-called longitudinal direction parallel to two edges opposite this plate 8 by being midway from the latter. This main partition thus separates the upper face 14 of the plate 8 into a first half and a second half marked 14A and 14B.

Each lateral partition 11 also has a rectangular shape, and also extends perpendicularly to the upper face 14, but by being oriented transversally, i.e. perpendicularly to the main partition 9.

Three identical lateral partitions 11 spaced from one another thus separate the first half 14A into three substantially parallelepiped housings 12 having approximately the same dimensions. Three other lateral partitions 11 also identical and spaced from one another separate the second half 14B into three other housings 12 having the same dimensions.

The main partition 9 includes two parallel walls 9.1 and 9.2 and spaced from one another which are connected to one another by an upper separator 9.3 and by a lower separator 9.4 parallel to one another and perpendicular to the walls that join them.

These separators 9.3 and 9.4 delimit in the partition 9 an air backflow channel 9r, an electrical control channel or chute 9e, and an air supply channel 9a. When the main partition 9 is in place on the plate 8 as in FIG. 2, the air backflow channel 9r runs along this plate 8, the air supply channel is the farthest away from this plate 8, and the control channel extends between the supply channel and the backflow channel.

Each lateral partition 11 also includes two parallel walls 11.1 and 11.2 and spaced from one another and connected to one another by an upper separator 11.3 and by a lower separator 11.4 parallel to one another and perpendicular to the walls that join them. These separators 11.3 and 11.4 delimit in each partition 11 an air backflow channel 11r, and an electrical control channel or chute 11e. When a lateral partition 11 is in place sur the plate 8 as in FIG. 2, its air backflow channel 11r runs along this plate 8, and its electrical control channel 11e is spaced from this plate 8.

Figure 3:
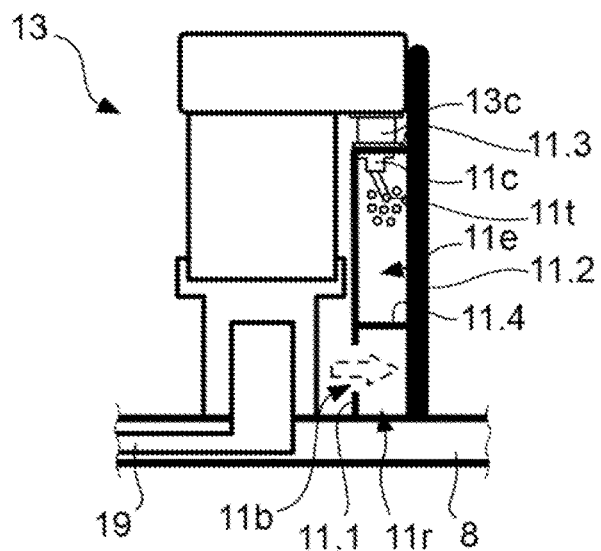
FIG. 3 is a lateral view as a local cross-section of a component in place in the module according to the invention.

As can be seen in FIG. 3, the upper separator 11.3 of each lateral partition 11 extends parallel to the plate 8 and includes an opening forming a seat wherein a socket 11c is mounted receiving a corresponding socket 13c of the electric component 13 installed in the housing 12 that this lateral partition 11 delimits. The openings forming a seat are marked 11s in FIG. 5. As can be seen in FIG. 3, when the assembly is mounted, a control cable 11t extends in the electrical channel 11e by having its end connected to the control socket 11c borne by the separator 11.3 of the partition 11.

Control Harness

Figure 4:
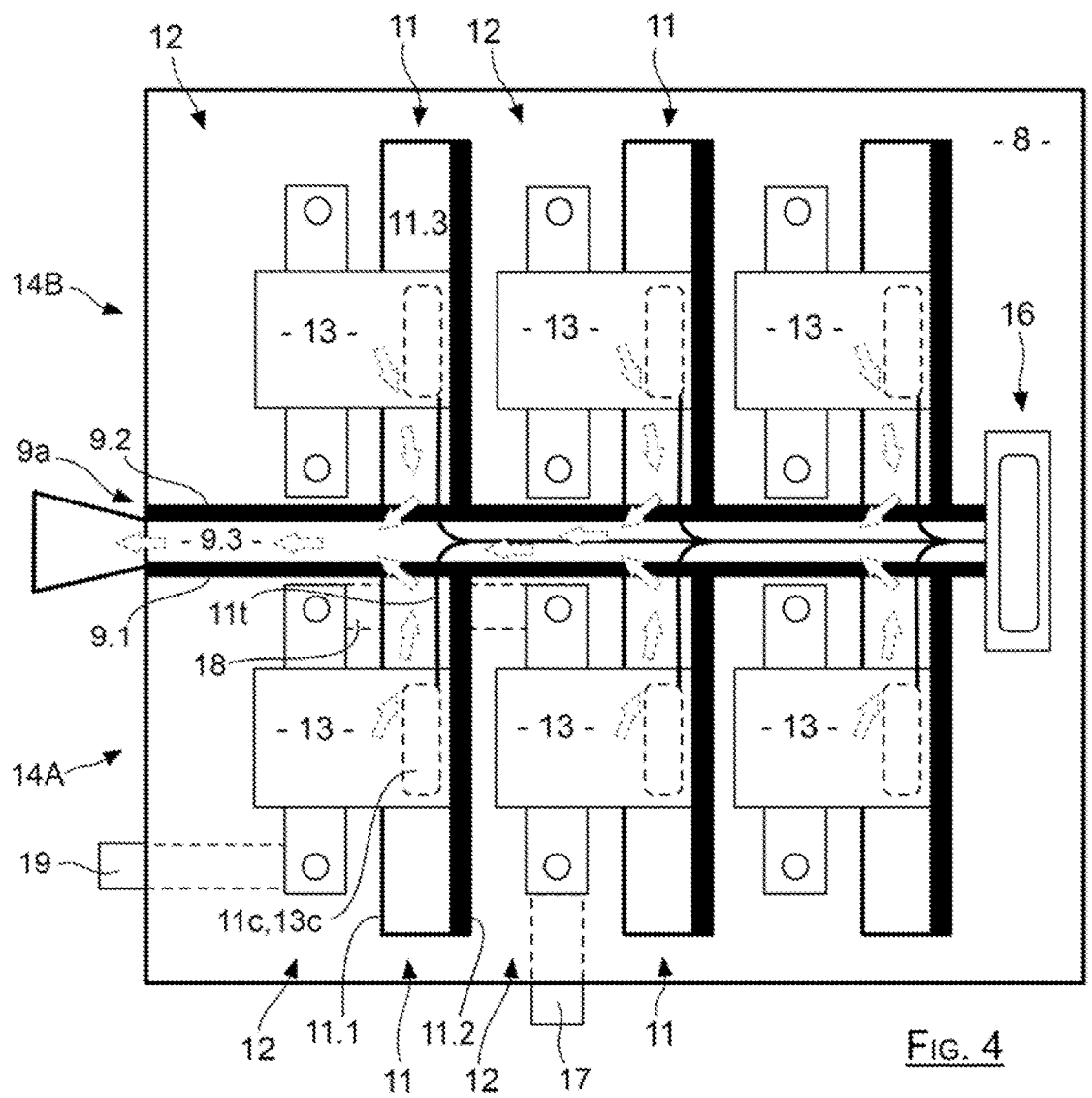
FIG. 4 is a top view showing the general arrangement of the module as well as partitions and electric components according to the invention.

As can be seen in FIG. 4, each lateral partition 11 thus includes a control socket 11c borne by its upper separator 11.3, and a control cable 11t connected to this socket and which extends in the electrical channel 11e of this lateral partition 11. This control cable is extended in the electrical control channel 9e of the main partition 9 to be connected to a general control socket 16 located at an end of the main partition 9.

The assembly of control cables 11t constitutes an electrical harness that makes it possible to control the different components 13, from the general control socket 16 to which all these cables 11t are connected.

As can be seen in FIG. 3, each control cable 11t of a partition 11 departs from the socket 11c of which this partition is provided and to which it is electrically connected to extend in the electrical channel 11e of this partition 11 and be engaged in the electrical channel 9e of the main partition 9 to be connected to the general control socket 16. In this respect, the lateral wall 9.1 of the main partition 9 includes at each lateral partition 11 an opening for putting the electrical channel 9e of this main partition 9 into communication with the electrical channel 11e of the corresponding lateral partition 11, the channels 9e and 11e being the same distance from the plate 8. The other lateral wall 9.2 of the partition 9 is also provided with communication openings of the same type, to allow for the installation in the different partitions of the electrical control harness connecting the general control socket 16 to the local control sockets 11c. Alternatively, the assembly formed by the socket 11c and the assembly of control cables 11t can be formed by a single component including the socket and printed circuit in the form of a nappe flexible.

Busbars

In addition to its control socket 13c through which it is connected to the control harness, each power component 13 is connected to busbars which are integrated into the thickness of the plate 8.

Three of these busbars, marked 17, 18, 19, appear in FIG. 4: two of them, namely bars 17 and 19 extend beyond the edge of the plate 8 to be connected to a power network of the installation. The bar 18 does not extend beyond the edges of the plate, and is integrated to the latter solely to connect to one another the power terminals of two power components 13 mounted in contiguous housings 12. In other words, the busbars 17-19 makes it possible to provide the power connection of two contiguous components 13. Other busbars not shown in FIG. 4 make it possible to connect the other components 13 together and to the power network of the installation.

As can be seen in FIG. 2, the bulbar 17 includes in the plate 8 an end constituting a power terminal 17p folded to form a segment 17.1 that extends perpendicularly beyond the upper face of this plate 8 and which is extended by a tongue 17.2 folded back parallel to the plate 8 and at a distance from the latter. The tongue 17.2 advantageously includes a tapped hole to receive a screw 21 for connecting and tightening a power terminal lug 13p of a component 13.

In the same way, the other busbars which are integrated into the plate 8 are terminated in the latter by connection ends or terminals spaced from the upper face of this plate 8, and advantageously includes a tapped hole for receiving a screw for fastening and connecting an electric power component terminal lug 13.

Mounting Power Components

Once the main partition 9 and the lateral partitions 11 have been mounted on the plate 8, and the lateral partitions 11 have been provided with control sockets 11c connected by the control cables 11t to the general control socket 16, the power components 13 can be installed in the module.

Mounting a power component 13 consists of positioning it in its housing, by placing its two power terminal lugs 13p on the terminals of the connection ends of the two busbars leading into this housing, and of placing its control socket 13c facing the control socket 11c borne by the partition 11 that delimits this housing. The component 13 is then pushed in to plug its control socket 13c into control socket 11c of the partition 11 so as to connect it to the control network. AS shall be understood, each local control socket 11c is here fixe and oriented perpendicularly to the plate 8, i.e. to receive a socket 13c moved perpendicularly to this plate in a direction of approaching the latter.

After this operation, two screws 21 are engaged through the power terminal lugs 13p of the component 13 into the tapped holes of the terminals of the busbars to connect it to the power network.

The power components 13 can thus be mounted and connected one after the other very simply in the module. Similarly, replacing a defective component consists of turning off the module, unscrewing the two screws 21 connecting the terminal lugs of the component to the power network, and pulling on the component in order to separate it from the plate 8 so as to disconnect it from the control network and to remove it from the module. A new component can then be installed very simply before turning it back on.

Cooling

The partitions of the module according to the invention that provide the integration and the holding of the control harness at a distance from the busbars, are also arranged to independently ventilate the different housings 12 that they delimit.

The cooling air is routed towards the different housings 12 mainly by the supply channel 9a of the main partition 9, i.e. by the upper portion of this main partition, this channel 9a being the one that is the farthest away from the plate 8. As can be seen in FIG. 2, the wall 9.1 includes several openings forming air supply vents 9b each putting the channel 9a in communication with a corresponding housing 12 of the half 14A. In the same way, the wall 9.2 also includes openings 9b that put the channel 9a into communication with the housings 12 of the half 14B.

The cooling air which is routed the channel 9a is thus distributed into the different housings 12 via the vents 9b, and this air is collected in each housing by means of backflow channels 11r.

In this respect, the lateral wall 9.1 of the main partition 9 includes at each lateral partition 11 another opening for the putting of the air backflow channel 9r of this main partition 9 into communication with the air backflow channel 11r of the corresponding lateral partition 11, the channels 9r and 11r extending along the plate 8. The other lateral wall 9.2 of the partition 9 is also provided with openings of the same type, for putting the channel 9r of the partition 9 into communication with the channels 11r of the other lateral partitions 11.

Figure 5:
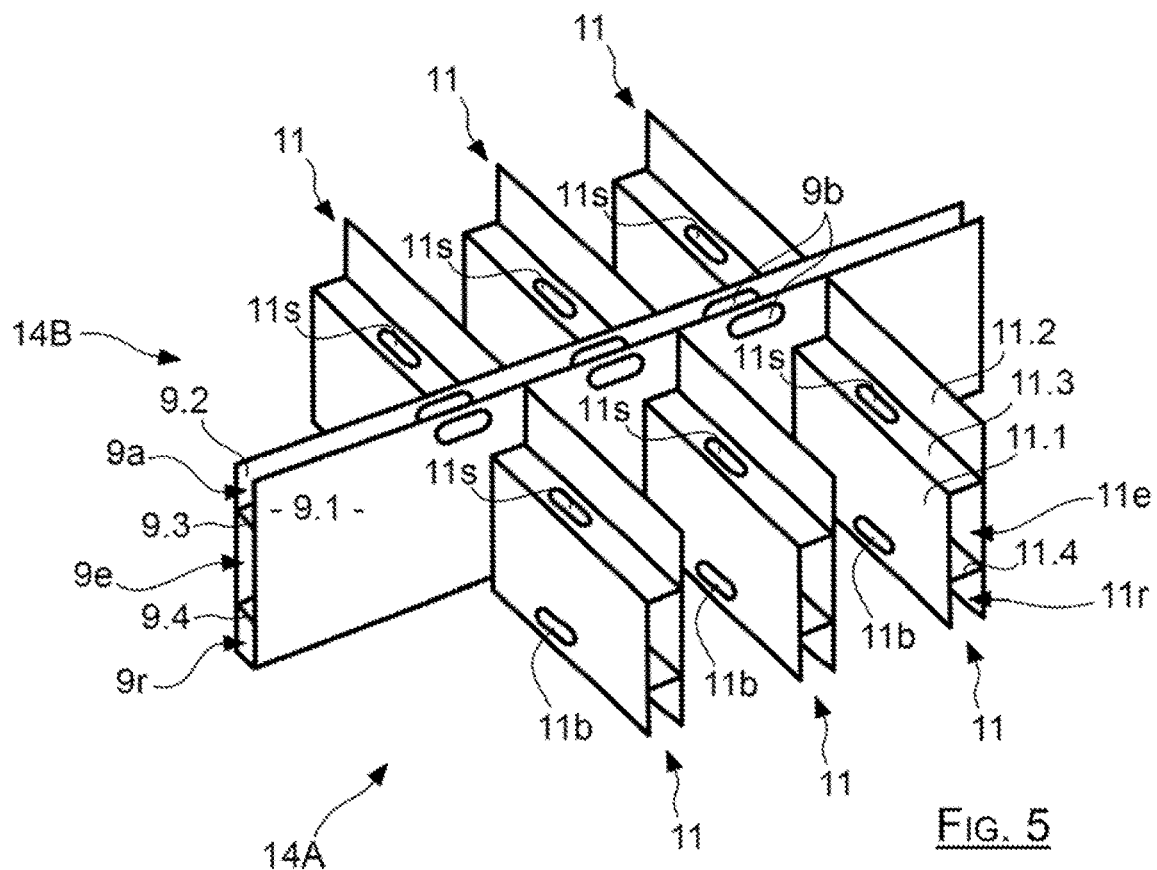
FIG. 5 is a first perspective view showing the partitions of the module according to the invention.
Figure 6:
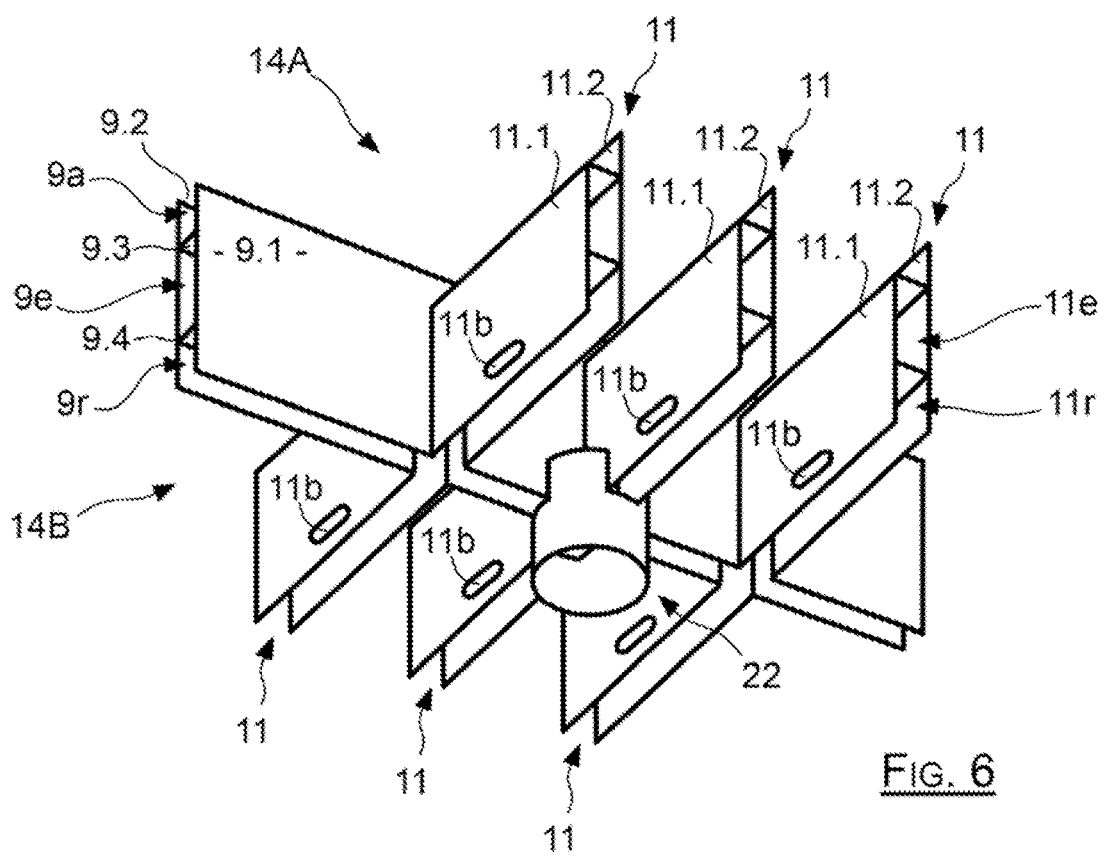
FIG. 6 is a second perspective view of the partitions of the module according to the invention.

Additionally, the wall 11.1 of each lateral partition 11 includes a suction vent 11b, visible in the FIGS. 3, 5 and 6, putting its air backflow channel 11r into communication with the housing contiguous to this partition 11. The channels 9r and 11r with the openings 9b thus form a recovery and backflow network of the cooling air that independently collects the air in each housing 12.

When the module is in service, the cooling air enters into each housing 12 by being routed therein by the channel 9a and through a vent 9b, and it is removed from each housing by the corresponding suction vent 11b so as to flow backward and be removed by the backflow network jointly formed by the channels 9r and 11r connected together.

In the example of FIG. 6, the cooling air discharged into the channel 9r is recovered by a central tubular collector 22 communicating with a central region of the channel 9r and with the channels 11r of the two median opposite lateral partitions 11. Ce tubular collector extends perpendicularly to the plate 8 that it passes through to lead facing the junction of the backflow channels of the central partition and of the two median lateral partitions.

Protection Against Fire

In order to improve the operating safety of the module, each partition is provided with a fire-resistant coating, in order to ensure that in the case where a module were to catch fire, it does not risk igniting the modules located in contiguous housings.

In this scope, on the one hand, the wall 11.2 of each lateral partition 11 is covered with a fire-resistant coating over most of its surface, and on the other hand the two walls 9.1 and 9.2 of the central partition are covered with a fire-resistant coating over most of their respective surfaces. In FIG. 4, the walls covered with fire-resistant coating are represented by heavy lines.

Components With an Extraction Lever

In the example of FIGS. 2 to 4, each component 13 is installed in a housing 12 via a direct connection of its control socket 13c in the corresponding control socket 11c of the housing 12, then by screwing the screws 21 through the terminal lugs 13p of this component 13 in the power terminals 17p.

Figure 7:
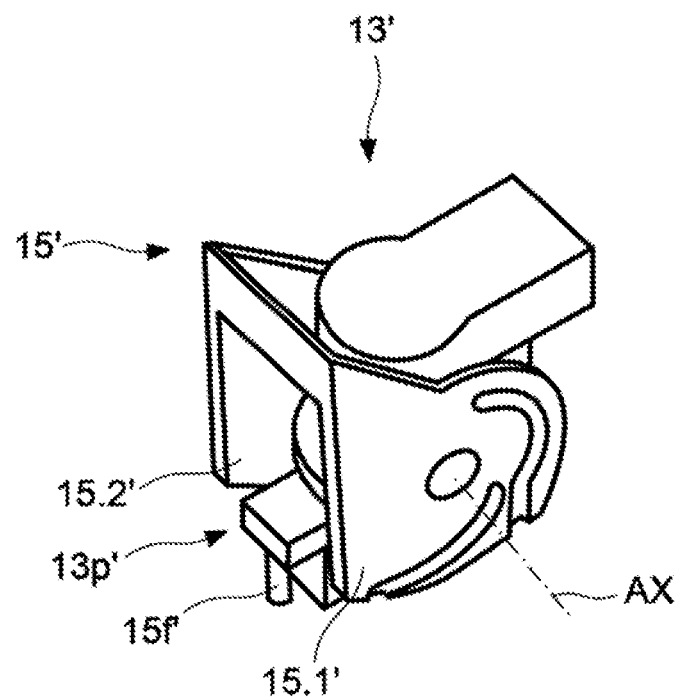
FIG. 7 is a perspective view of a component with an insertion/extraction lever in its unlocked state.
Figure 8:
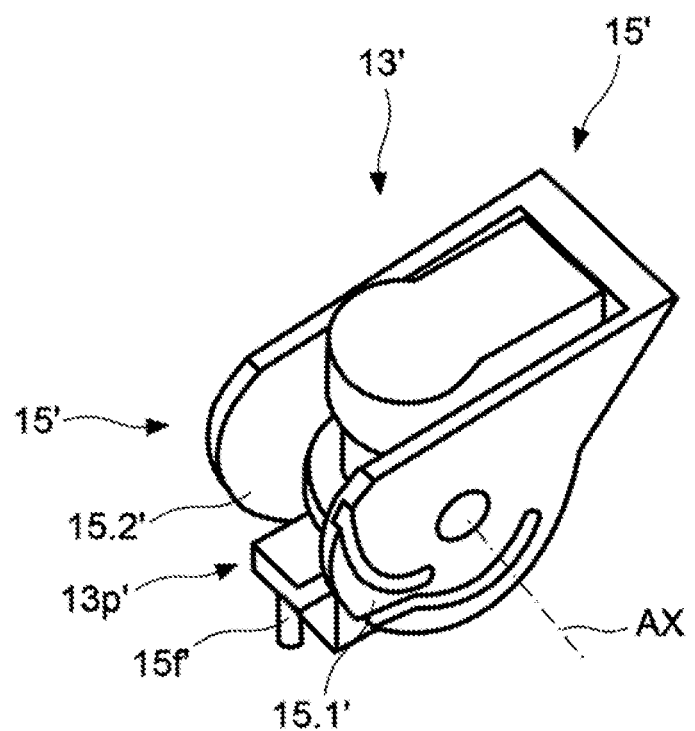
FIG. 8 is a perspective view of a component with an insertion/extraction lever in its locked state.

The module according to the invention can also be provided with electric power components 13' with an insertion/extraction lever of the type shown in FIGS. 7 and 8. Such a component 13' includes more particularly a rotating lever 15' movable between a deployed unlocked state corresponding to the one of FIG. 7, and a folded back locked state corresponding to the one of FIG. 8.

In such a component 13' each power terminal lug 13p' includes a connection plug 13f in the form of a stud that is inserted directly into a hole of a corresponding power terminal, to connect this component to the power network via simple snap-fitting, i.e. without a tightening screw.

The lever 15' includes two flanks 15.1' and 15.2' coupled to the body of the component to form a pivoting link of this lever 15' with respect to the body, about an axis AX perpendicular to the direction of insertion of the component, i.e. to plugs 13f. Each flank 15.1', 15.2' includes two external grooves able to receive fixed guide studs not visible in the figures and borne by the module.

The installation of a component 13' thus consists firstly of positioning its lever 15' in the unlocked state, then of placing this component 13' with its plugs 13f facing power terminals and its control socket 13c facing the control socket 11c of the housing. The component 13' is then lowered into the housing to engage the fixed studs in the lateral grooves, after which the lever 15' is folded back towards its locked position to connect the component electrically and completely.

Removing such a component 13' when it has to be replaced consists, on the contrary, of manipulating its lever 15' to move it from its locked position to its unlocked position, which has for effect to separate the component 13' from the plate 8 while at the same time disconnecting it from the power circuit and from the control circuit. The component 13' can then be removed from the module, to be replaced therein with a new component.

Advantages

Generally, the invention makes it possible to provide a solution of a module of which the partitions provide a segregation of the control cables and of the busbars, protection against fire for the different modules, an optimised cooling as close as possible to each component, and an electromechanical interface that makes it possible to facilitate the mounting and dismounting of each electric component.

Each partition thus ensures the physical, electrical and thermal segregation of the various elements of the module tout by ensuring the passage and the holding of the control cables and the cooling thereof.

The invention claimed is:

1. Electric distribution module comprising a plate (8) provided with busbars (17-19) and bearing a main partition (9) as well as lateral partitions (11) that jointly delimit a plurality of housings (12) each intended for receiving an electric power component (13, 13'), wherein the main partition (9) includes at least one channel (9e, 9r), and wherein each lateral partition (11) comprises at least one channel (11e, 11r) that communicates with a channel (9e, 9r) of the main partition (9) and that is terminated by an opening (11b) leading into a housing (12) that this lateral partition (11) delimits, so to as to ensure, via these channels the routing and holding of control cables (11t) towards each housing (12) and/or independent ventilation of each housing (12).

2. Module according to claim 1, wherein the main partition (9) includes an air circulation channel (9r) and an electrical channel (9e) forming a duct for receiving one or more control cables (11t), and wherein each lateral partition (11) includes an air circulation channel (11r) and an electrical channel (11e) forming a duct for receiving control cables (11t) that communicates with a corresponding channel (9r, 9e) of the main partition (9).

3. Module according to claim 2, wherein each lateral partition (11) includes an opening (11s) terminating its electrical channel (11e) and forming a seat bearing a control socket (11c) connected to a control cable (11t) extending in this electrical channel (11e), and wherein this socket (11c) is oriented perpendicularly to the plate (8) in order to receive a connector of an electric power component (13, 13').

4. Module according to claim 3, comprising a general control socket (16) located at the end of the main partition (9) that is connected to each control socket (11c) by control cables (11t) extending in the electric channels (9e, 11e) of the main partition (9) and lateral partitions (11).

5. Module according to claim 1, including busbars (17, 19) integrated into the thickness of the plate (8) and which each include an end extending beyond a face of this plate (8) to form a power terminal (17p) for an electric power component (13, 13').

6. Module according to claim 5, wherein each power terminal (17p) includes a tapped hole oriented perpendicularly to the plate (8).

7. Module according to claim 1, wherein each partition (9, 11) includes at least one wall (9.1, 9.2, 11.2) covered with a fire-resistant coating over most of its surface.

8. Module according to claim 1, wherein the main partition (9) includes two walls (9.1, 9.2) both covered with a fire-resistant coating over most of their respective surfaces.

9. Module according to claim 1, provided with at least one power component (13') including an extraction lever (15').

* * * * *